United States Patent
Fujii et al.

(10) Patent No.: US 9,712,039 B2
(45) Date of Patent: Jul. 18, 2017

(54) IN-VEHICLE POWER CONVERSION SYSTEM

(75) Inventors: Yoshiyuki Fujii, Chiyoda-ku (JP); Katsuhisa Kodama, Chiyoda-ku (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 366 days.

(21) Appl. No.: 14/383,194

(22) PCT Filed: Aug. 29, 2012

(86) PCT No.: PCT/JP2012/071836
§ 371 (c)(1),
(2), (4) Date: Sep. 5, 2014

(87) PCT Pub. No.: WO2014/033852
PCT Pub. Date: Mar. 6, 2014

(65) Prior Publication Data
US 2015/0048675 A1    Feb. 19, 2015

(51) Int. Cl.
*H02M 1/12* (2006.01)
*H02G 3/00* (2006.01)
(Continued)

(52) U.S. Cl.
CPC .............. *H02M 1/12* (2013.01); *B60L 1/02* (2013.01); *B60L 3/003* (2013.01); *B60L 11/18* (2013.01);
(Continued)

(58) Field of Classification Search
CPC . H02M 1/12; H02M 7/003; B60L 1/12; B60L 3/003; B60L 11/18; B60L 11/1803;
(Continued)

(56) References Cited

U.S. PATENT DOCUMENTS

| 4,717,990 A | 1/1988 | Tugcu |
| 2004/0090748 A1 | 5/2004 | Kishimoto et al. |

(Continued)

FOREIGN PATENT DOCUMENTS

| DE | 102008000976 A1 | 10/2009 |
| EP | 1418798 A2 | 5/2004 |

(Continued)

OTHER PUBLICATIONS

Communication dated Mar. 30, 2016 from the European Patent Office in counterpart application No. 12883588.1.

(Continued)

*Primary Examiner* — Hal Kaplan
(74) *Attorney, Agent, or Firm* — Sughrue Mion, PLLC; Richard C. Turner

(57) ABSTRACT

An in-vehicle power conversion system, which can shield a circuit unit without using a particular shield member and can achieve reduction in cost and size, is obtained. Included are: a conductive housing having an opening; and a multilayer printed wiring board in which circuit units are mounted and one layer is a GND plane. The multilayer printed wiring board is assembled to an opening surface of an opening of the conductive housing to form a closed space; and the GND plane of the multilayer printed wiring board is electrically connected to the conductive housing to shield the circuit units stored in the closed space surrounded by the conductive housing and the multilayer printed wiring board.

18 Claims, 14 Drawing Sheets

(51) Int. Cl.
*B60L 11/18* (2006.01)
*H05K 7/14* (2006.01)
*H05K 9/00* (2006.01)
*H05K 1/02* (2006.01)
*B60L 1/02* (2006.01)
*B60L 3/00* (2006.01)
*H02M 7/00* (2006.01)

(52) U.S. Cl.
CPC ....... *B60L 11/1803* (2013.01); *B60L 11/1805* (2013.01); *B60L 11/1809* (2013.01); *H05K 1/0203* (2013.01); *H05K 7/1432* (2013.01); *H05K 9/0037* (2013.01); *B60L 2210/30* (2013.01); *B60L 2240/36* (2013.01); *B60L 2240/525* (2013.01); *B60L 2240/662* (2013.01); *B60L 2270/145* (2013.01); *H02M 7/003* (2013.01); *H05K 1/0209* (2013.01); *H05K 2201/066* (2013.01); *Y02T 10/7005* (2013.01); *Y02T 10/7241* (2013.01); *Y02T 10/7291* (2013.01); *Y02T 90/16* (2013.01)

(58) Field of Classification Search
CPC .............. B60L 11/1805; B60L 11/1809; B60L 2210/30; B60L 2240/36; B60L 2240/525; B60L 2240/562; B60L 2270/145; H05K 1/0203; H05K 1/0209; H05K 7/1432; H05K 9/0037; H05K 2201/066; Y02T 10/7005; Y02T 10/7241; Y02T 10/7291; Y02T 90/16

USPC .................................................. 307/9.1, 10.1
See application file for complete search history.

(56) References Cited

U.S. PATENT DOCUMENTS

2009/0086462 A1  4/2009  Funato et al.
2009/0251843 A1  10/2009  Hironaka

FOREIGN PATENT DOCUMENTS

| EP | 2043418 A2 | 4/2009 |
|---|---|---|
| JP | 06-069680 A | 3/1994 |
| JP | 06-104590 A | 4/1994 |
| JP | 09-162594 A | 6/1997 |
| JP | 2001-044685 A | 2/2001 |
| JP | 2004-364025 A | 12/2004 |
| JP | 2006-230064 A | 8/2006 |
| JP | 2009-088048 A | 4/2009 |

OTHER PUBLICATIONS

Communication dated Jan. 6, 2015, issued by the Japanese Patent Office in counterpart Japanese application No. 2014-532628.
International Search Report for PCT/JP2012/071836 dated Nov. 13, 2012.
Communication dated Jan. 25, 2017 from the State Intellectual Property Office of the P.R.C. in counterpart Application No. 201280075545.8, 12 pages total with translation.

IN-VEHICLE POWER CONVERSION SYSTEM

CROSS REFERENCE TO RELATED APPLICATIONS

This application is a National Stage of International Application No. PCT/JP2012/071836 filed Aug. 29, 2012, the contents of all of which are incorporated herein by reference in their entirety.

TECHNICAL FIELD

The present invention relates to an in-vehicle power conversion system such as an inverter, a DC/DC converter, and a charger, which are equipped in an electric vehicle such as an electric car and a hybrid car, in which a motor serves as at least a driving source and, more particularly, relates to an internal structure thereof.

BACKGROUND ART

An in-vehicle power conversion system to be equipped in an electric vehicle is equipped with various sorts of power conversion apparatuses, such as an inverter which is for driving a motor, a DC/DC converter which steps down from a high battery voltage to a 12 V system battery voltage, a DC/DC converter which steps up from the 12 V system battery voltage to the high battery voltage, a charger which is for charging from a commercial power source to a high voltage battery, and an inverter which generates from the high voltage battery to an AC 100 V. In the internal configuration of these power conversion apparatuses, there is generally used a switching circuit, such as a chopper circuit or a bridge circuit, whose generated high frequency noise is large; and various filter circuits and shield structures are used for their countermeasures against the noise.

In circumstances surrounding current electric vehicles, requirements for reduction in size and cost of components thereof are extremely strong and various types of power conversion apparatuses to be equipped in electric vehicles are also no exception. One of important techniques of means of achieving reduction in size and cost of these power conversion apparatuses is a speeding up of switching frequency. The speeding up of the switching frequency can reduce in size and cost of large and expensive transformer and reactor; and thus, the speeding up is one of extremely important technical development elements for various types of power conversion apparatuses.

However, conductive noise and radiation noise including a surge voltage increase and become high frequency in a power system circuit of the power conversion apparatus which performs switching of a large current and a high voltage; and accordingly, the conductive noise and the radiation noise including the surge voltage are superimposed on a peripheral circuit of the power system circuit and a control circuit due to indirect causes such as via stray capacitance, via GND and a housing, or crosstalk and a failure that damages the stable operation of the circuit is generated. Furthermore, when the conductive noise or the radiation noise due to the large current switching is superimposed on a filter circuit of input and output, there exists a problem in that filter characteristics are deteriorated and original filter performance cannot be exerted due to a phenomenon in which noise is superimposed again on a line in which filtering is performed.

As countermeasures against such noise interference, countermeasures such as suppression of noise interference by the use of a local shield at the inside of the apparatus, filter enhancement, and the ingenuity of circuit layouts are conducted. For example, FIG. 14 is one example that achieves the local shield at the inside of the apparatus and shows a configuration sectional view of a conventional in-vehicle power conversion system.

In FIG. 14, reference numeral 211 denotes a housing and 212 denotes a housing cover, both of which use a conductive component and have a role to shield the whole apparatus. In this case, 203 denotes a filter circuit unit; 204 denotes a power system main circuit unit; 205 denotes a control circuit unit; 213 denotes a shield case for the filter circuit; and 214 denotes a shield case for the power system main circuit. In the thus configured apparatus, noise generated in the power system main circuit unit 204 is shielded by the shield case for the power system main circuit 214; and the noise does not give an influence on the control circuit unit 205 and the filter circuit unit 203.

Noise generated in the control circuit unit 205 is shielded from leaking to the outside by the housing 211 and the housing cover 212, both of which shield the whole apparatus, and the noise does not give an influence on other circuit units by the shield case for the power system main circuit 214 and the shield case for the filter circuit 213. The filter circuit unit 203 itself does not generate noise. However, when the filter circuit unit 203 receives the influence of noise from other circuit units, filter performance according to the attenuation characteristics of the filter cannot be exerted; and thus, noise propagation from other circuits is shielded by the shield case for the filter circuit 213.

Incidentally, undermentioned Patent Document 1 is one in which a shield space is formed by a chassis and a shield case. Patent Document 2 is one in which a cut-out portion is formed in a shield metal to suppress high frequency noise of a choke coil in a low pass filter circuit.

PRIOR ART DOCUMENT

Patent Document

Patent Document 1: Japanese Unexamined Patent Publication No. 2004-364025
Patent Document 2: Japanese Unexamined Patent Publication No. H6-104590

SUMMARY OF THE INVENTION

Problems to be Solved by the Invention

As described above, the shield case needs to be provided in the housing separately for the countermeasures against noise due to high frequency applications of switching frequency; however, it causes an increase in cost, such as an increase in the number of components and an increase in production process. More particularly, addition of the shield component not only causes an increase in size of the product but also generates various problems such as an increase in member cost, an increase in weight, and deterioration in productivity. In a proposal which deletes the shield cases in the inside of the housing by using own walls of the housing and the housing cover, the substrate needs to be divided as a negative effect and it also causes an increase in cost, such as an increase in substrate cost and an increase in production process and, in addition, an increase in size of the product due to an increase in substrate fixing point is unavoidable.

Furthermore, reduction in size of the transformer, the reactor, and a common mode choke coil, which are used in the power conversion apparatus, cause a new problem in that heat generation density increases; and accordingly, problems arise in that a general shield structure causes to disturb heat dissipation, the own maximum operation temperature is exceeded by a temperature rise of a heating component itself, deterioration in performance as a magnetic component is caused, and peripheral components are exposed to high temperature environment. In order to configure further effective heat dissipation paths, a structure which is for separately forming heat dissipation paths needs to be prepared; and accordingly, not only a degree of freedom in design including insulation with respect to peripheral components is deprived but also a reduction in size is difficult and an increase in cost due to additional members is also caused.

Additionally, in a general shield structure, as countermeasures against vibrations of the transformer, the reactor, or the common mode choke coil, which are heavy material, a structure that holds those needs to be prepared; and accordingly, not only a degree of freedom in design including the aforementioned heat dissipation constraints and insulation with respect to peripheral components is deprived but also a reduction in size is difficult and an increase in cost due to additional members is also caused.

The present invention has been made to solve the problem described above, and an object of the present invention is to provide an in-vehicle power conversion system which does not disturb a reduction in size, suppresses an increase in cost, and achieves a shield function.

Means for Solving the Problems

According to the present invention, there is provided an in-vehicle power conversion system to be equipped in an electric vehicle in which a motor serves as at least a driving source, the in-vehicle power conversion system including: a conductive housing having an opening; and a multilayer printed wiring board on which a circuit unit is mounted and at least one layer is a GND plane. The multilayer printed wiring board is assembled on the opening surface of the opening of the conductive housing to form a closed space; and the GND plane of the multilayer printed wiring board is electrically connected to the conductive housing to shield the circuit unit stored in the closed space surrounded by the conductive housing and the multilayer printed wiring board.

Furthermore, according to the present invention, there is provided an in-vehicle power conversion system which includes: the conductive housing in which the opening is divided by a conductive partition wall to form a plurality of openings; and the multilayer printed wiring board in which a plurality of circuit units are mounted and at least one layer is the GND plane. The multilayer printed wiring board is assembled on the opening surfaces of the plurality of the openings formed by the conductive housing and the conductive partition wall to form a plurality of closed spaces; and the GND plane of the multilayer printed wiring board is electrically connected to the conductive housing to respectively shield the circuit units that are respectively stored in the plurality of closed spaces.

Furthermore, according to the present invention, there is provided an in-vehicle power conversion system in which the multilayer printed wiring board is assembled on the opening surfaces of the plurality of the openings to form the plurality of closed spaces; the GND planes corresponding to the plurality of the closed spaces are mechanically separated to be independent for each of the corresponding respective closed spaces; and the GND planes which are independent for each of the respective closed spaces of the multilayer printed wiring board are respectively electrically connected to the conductive housing to respectively shield the circuit units that are respectively stored in the plurality of the closed spaces.

Furthermore, according to the present invention, there is provided an in-vehicle power conversion system in which the GND plane of the multilayer printed wiring board is formed on any surface portion of the multilayer printed wiring board; and the multilayer printed wiring board is assembled on the opening surface of the opening so that the GND plane formed on the surface portion of the multilayer printed wiring board is the opposite side to the closed space side.

Advantageous Effect of the Invention

The in-vehicle power conversion system according to the present invention electrically connects the GND plane of the multilayer printed wiring board to the conductive housing and stores the circuit units in the closed space surrounded by the conductive housing and the multilayer printed wiring board, whereby the circuit units can be shielded without using a particular shield member, reduction in cost and size can be achieved, the number of components can be reduced, and it becomes possible to improve productivity.

Furthermore, the in-vehicle power conversion system according to the present invention assembles the multilayer printed wiring board to the opening surface of the plurality of openings formed by the conductive housing and the conductive partition wall to form the plurality of closed spaces and respectively stores the circuit units in the plurality of the closed spaces, whereby the circuit units can be respectively shielded and noise interference between the circuit units can be suppressed.

Furthermore, the in-vehicle power conversion system according to the present invention mechanically separates the GND planes corresponding to the plurality of closed spaces to be independent for each of the corresponding respective closed spaces and respectively electrically connects the GND planes that are independent for each of the respective closed spaces to the conductive housing, whereby there is solved a disadvantage in which a return current that flows through the GND plane corresponding to one circuit unit flows through the GND plane corresponding to other circuit unit in the circuit units that are respectively stored in the plurality of the closed spaces.

Furthermore, the in-vehicle power conversion system according to the present invention forms the GND plane on a surface portion of the multilayer printed wiring board and assembles the multilayer printed wiring board on the opening surface of the opening so that the GND plane formed on the surface portion of the multilayer printed wiring board is the opposite side to the closed space side, whereby a housing cover can be changed from a conductive component to an inexpensive component such as a resin component that does not have a conducting function, and reduction in size, weight, and cost of the whole system can be achieved.

Objects, features, aspects, and advantageous effects other than the foregoing of the present invention will become more apparent from the following detailed description of the present invention which refers to the accompanying drawings.

MODE FOR CARRYING OUT THE INVENTION

Embodiment 1

Figure 1:
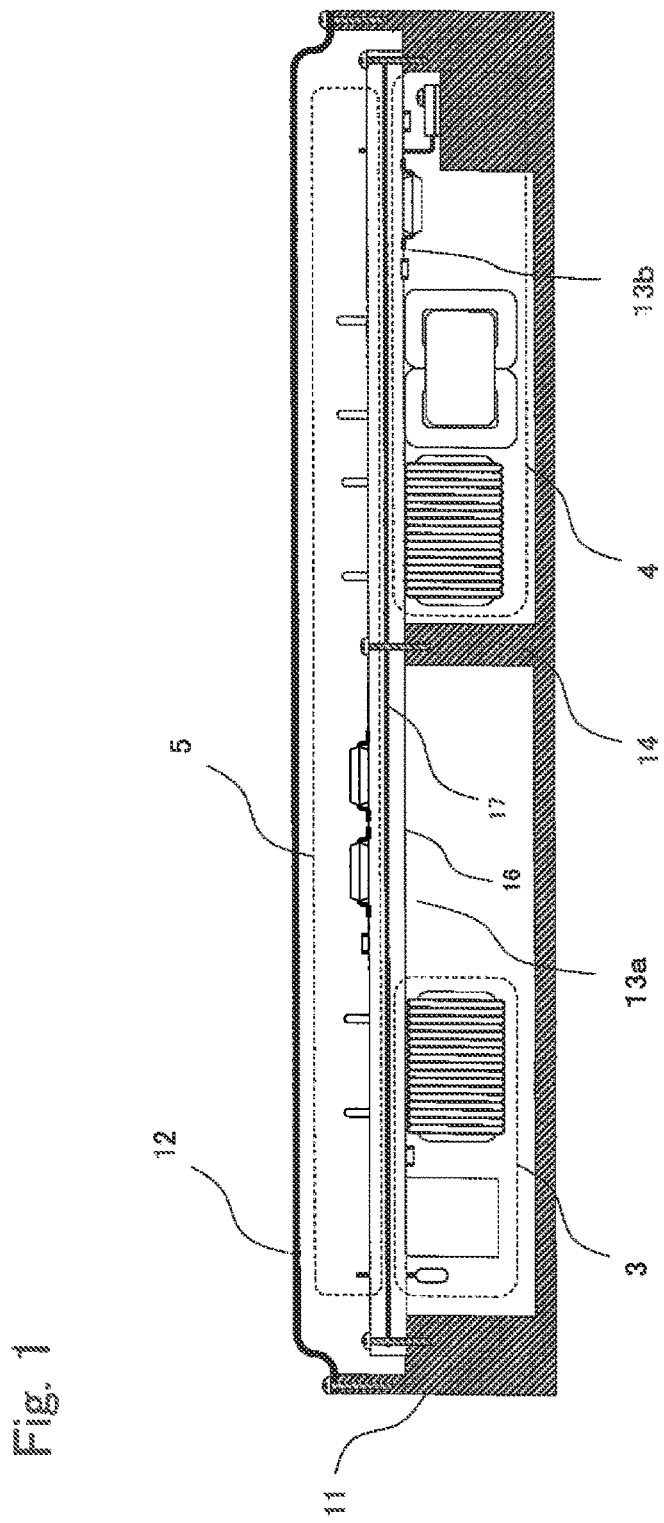
FIG. 1 is a configuration sectional view showing an in-vehicle power conversion system in Embodiment 1 of the present invention.

FIG. 1 is a configuration sectional view showing an in-vehicle power conversion system (hereinafter, referred to abbreviated as power conversion system) in Embodiment 1 of the present invention. The power conversion system is equipped in an electric vehicle in which a motor serves as at least a driving source. In the same drawing, reference numeral 11 denotes a housing having an opening and 12 denotes a housing cover, both of which are made of a conductive member and have a role to shield the whole apparatus. In this case, the housing 11 is made of aluminum die casting and the housing cover 12 is made of plate. 16 denotes a multilayer printed wiring board; and 17 denotes a GND plane and is an optional one layer of an inner layer or an outer layer of the multilayer printed wiring board. In this case, 3 denotes a filter circuit unit mounted on the multilayer printed wiring board 16; 4 denotes a power system main circuit unit similarly mounted on the multilayer printed wiring board 16; 5 denotes a control circuit unit mounted on the multilayer printed wiring board 16; and only the control circuit unit 5 is mounted so as to be opposite to the filter circuit unit 3 and the power system main circuit unit 4 at the boundary of the GND plane 17. The filter circuit unit 3, the power system main circuit unit 4, and the control circuit unit 5 have electric and electronic components.

In this case, at a screw portion where the multilayer printed wiring board 16 is assembled and fixed to the opening surface of an opening of the housing 11, a screw hole of the printed wiring board is formed in a through hole shape electrically connected to the GND plane 17; and a screw is fastened to the housing 11 and the conductive partition wall 14 and thus the GND plane 17 is grounded at housing potential. More specifically, the GND plane 17 is electrically connected to the housing 11. The partition wall 14 is integrally formed with the housing 11 by aluminum die casting. The opening formed in the housing 11 is divided by the partition wall 14 to form a plurality of openings 13a, 13b. One common multilayer printed wiring board 16 is assembled and fixed to the opening surfaces of the plurality of the openings 13a, 13b to form a plurality of closed spaces.

In the thus configured power conversion apparatus, first, the filter circuit unit 3 is formed with an electromagnetically closed space by the housing 11, the partition wall 14, and the GND plane 17; and therefore, the filter circuit unit 3 does not receive the influence of noise from other circuit units (circuit blocks). The power system circuit unit 4 is also the same; and an electromagnetically closed space is formed by the housing 11, the partition wall 14, and the GND plane 17; and therefore, the power system circuit unit 4 is shielded. As for the control circuit unit 5, a closed space is formed by the housing 11, the housing cover 12, and the GND plane 17; and the control circuit unit 5 is shielded. The GND plane 17 is preferable to be a conductive plate that covers the whole surfaces of portions opposite to the closed spaces. Incidentally, the GND plane is a planar shaped pattern formed on the printed substrate and, normally, has a size as large as the entire printed substrate and a sufficiently large area with respect to signal lines.

In Embodiment 1, circuit units that do not intend to be electromagnetically coupled at the boundary of the GND plane 17 are arranged on a surface portion (one surface portion) and a back portion (other surface portion) of the multilayer printed wiring board 16 to be able to shield with each other. Separation and shielding are made between the circuit units via the housing 11, the partition wall 14, and the GND plane 17 in Embodiment 1; and therefore, noise interference between the circuit units is suppressed to prevent erroneous operation and stable operation of the circuits can be achieved. Furthermore, the circuit unit can be shielded without using a particular shield member, reduction in cost and size can be achieved, the number of components can be reduced, and productivity is improved. In addition, the multilayer printed wiring board 16 is assembled on the opening surfaces of the plurality of openings 13a, 13b formed by the housing 11 and the partition wall 14 to form the plurality of closed spaces and the circuit units are respectively stored in the plurality of closed spaces; and therefore, the circuit units can be respectively shielded and noise interference between circuits can be suppressed.

Embodiment 2

Figure 2:
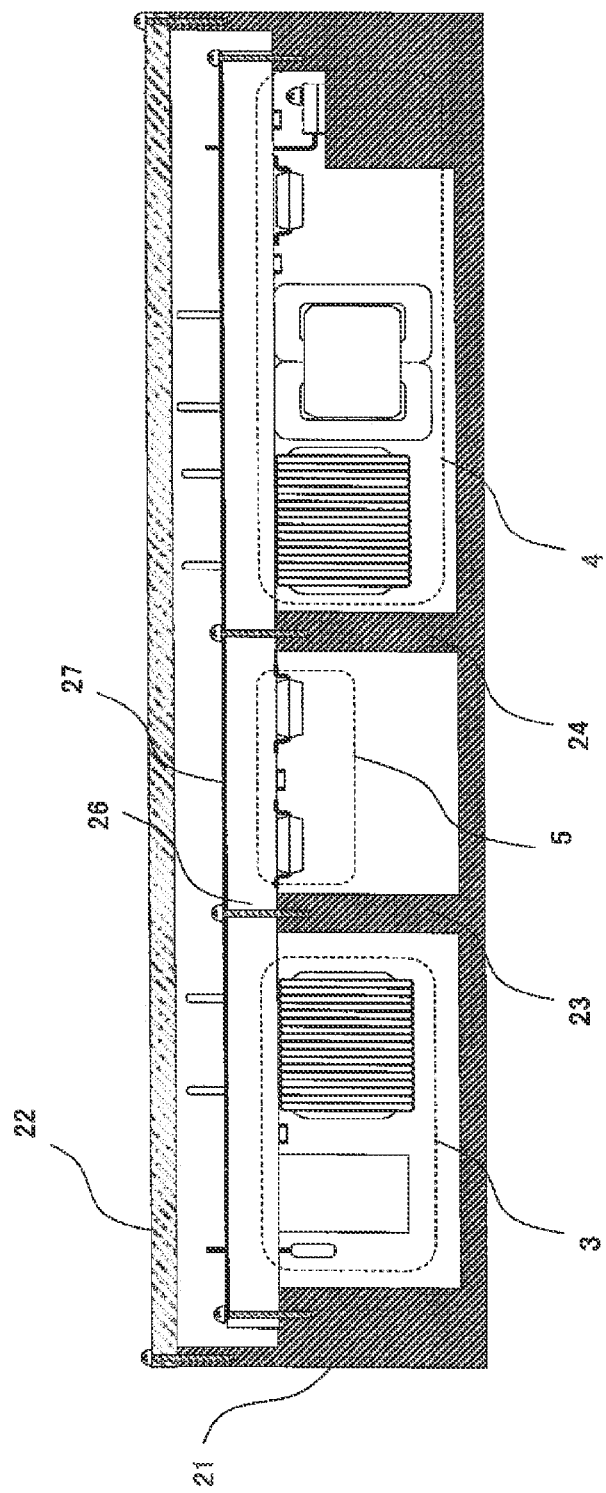
FIG. 2 is a configuration sectional view showing an in-vehicle power conversion system in Embodiment 2.

FIG. 1 shows the shield structure in which the GND plane is formed on the optional one layer of the multilayer printed wiring board; however, Embodiment 2 provides a structure which further achieves a reduction in weight. FIG. 2 is a configuration sectional view showing a power conversion system in Embodiment 2. In the same drawing, reference numeral 21 denotes a conductive housing and 22 denotes a non-conductive housing cover. In this case, the housing 21 is made of aluminum die casting and the housing cover 22 is made of a resin material (for example, a polybutylene terephthalate (PBT) resin material, a polyphenylene sulfide (PPS) resin material, or the like). Incidentally, the same reference numerals as those shown in the respective drawings represent the same or corresponding elements, and the same applies hereinafter.

The housing 21 includes a conductive partition wall 23 having a function that electromagnetically partitions the filter circuit unit 3 from the control circuit unit 5; and a conductive partition wall 24 having a function that electromagnetically partitions a power system main circuit unit 4 from the control circuit unit 5. The partition walls 23, 24 are integrally formed with the housing 11 by aluminum die casting. 26 denotes a multilayer printed wiring board; and 27 denotes a GND plane and is formed on a surface portion of the multilayer printed wiring board 26 as an outer layer. In this case, all the circuit units of the filter circuit unit 3, the power system main circuit unit 4, and the control circuit unit 5, which are mounted on the multilayer printed wiring board 26, are mounted on the surface portions opposite to the GND plane. In Embodiment 2, the multilayer printed wiring board 26 is assembled with face down (with the mounting surface downward) and attached to the opening surfaces of a plurality of openings of the housing 21 by screw clamping so that the respective circuit units are separated by the housing 21 and the partition walls 23, 24.

At the screw portion, a screw hole of the multilayer printed wiring board 26 is formed in a through hole shape as in Embodiment 1 and the screw portion is fastened to the housing 21 and the partition walls 23, 24; and thus, the GND plane 27 is grounded to housing potential. More specifically, the GND plane 27 is electrically connected to the housing 21.

In the thus configured power conversion apparatus, first, the filter circuit unit 3 is formed with an electromagnetically closed space by the housing 21, the partition wall 23, and the GND plane 27; and therefore, the filter circuit unit 3 does not receive the influence of noise from other circuit units. The control circuit unit 5 and the power system circuit unit 4 are also similar; the control circuit unit 5 is shielded by the partition walls 23, 24 and the GND plane 27 and the power system circuit unit 4 is shielded by the housing 21, the partition wall 24, and the GND plane 27; and thus, the control circuit unit 5 and the power system circuit unit 4 are electromagnetically shielded with each other. Further, the whole system is shielded; and therefore, the housing cover 22 can be made of a non-conductive material such as resin.

Furthermore, the GND plane 27 is formed on the surface portion of the multilayer printed wiring board 26 and the multilayer printed wiring board 26 is assembled on the opening surfaces of the openings so that the GND plane 27 formed on the outer layer of the surface portion of the multilayer printed wiring board 26 is the opposite side to the closed space side; and therefore, the cover of the whole system can be changed from a conductive component to an inexpensive component such as a resin component that does not have a conducting function, and reduction in size, weight, and cost of the whole system can be achieved.

Embodiment 3

In Embodiment 1, 2, the noise interference between the respective circuit units is suppressed by the shield structure using the GND plane; and thus, erroneous operation is prevented and stable operation of the circuits is achieved without producing particular cost increase. It enables to reduce the number of components, to simplify production processes, and to improve workability, without dividing the multilayer printed wiring board; and thus, reduction in size and cost is achieved. Further, there is provided the structure in which when the outer layer serves as the GND plane, the cover of the whole system can be changed from the conductive component to the inexpensive component such as the resin component that does not have the conducting function, and reduction in size, weight, and cost of the whole system can be achieved.

In Embodiment 1, 2, the GND plane is made to be common to the filter circuit unit 3, the control circuit unit 5, and the power system circuit unit 4. Thus, a return current that flows through the GND plane on some circuit unit flows through the GND plane on other circuit unit depending on the input/output position of each power supply and signal wire and GND potential is fluctuated; and accordingly, there is a possibility that circuit operation becomes unstable and propagation of unintentional noise is generated. This problem can be solved if a return current path can be considered in designing the printed wiring board; however, a degree of freedom in design is deprived and not only it makes difficult to design but also it may be actually possible that the consideration of the return current path is essentially inevitable from the view point of layout of each circuit unit.

Figure 3:
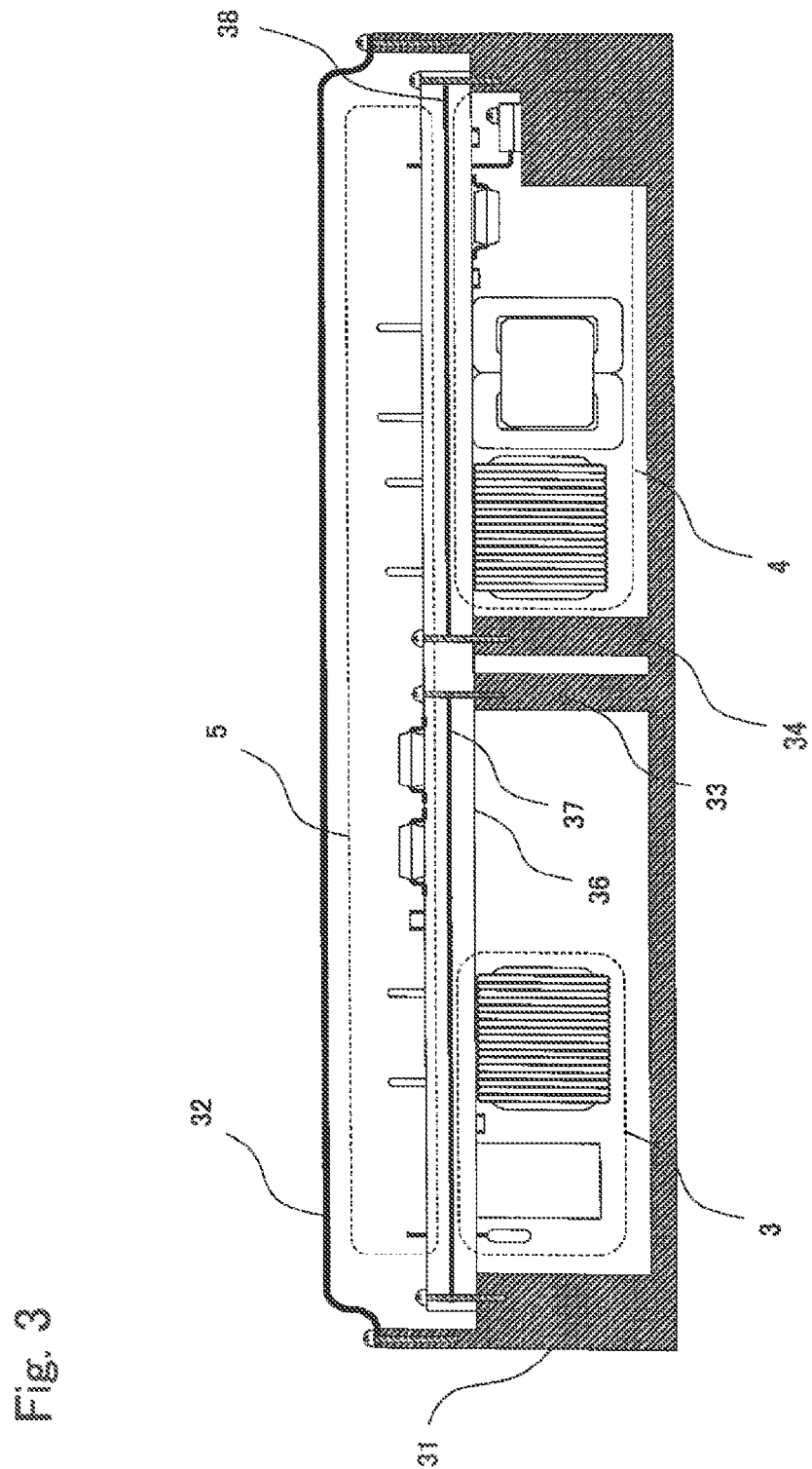
FIG. 3 is a configuration sectional view showing an in-vehicle power conversion system in Embodiment 3.

In Embodiment 3, there is provided a structure in which constraint of the return current in the substrate is eliminated and an improvement of a degree of freedom in design can be achieved. FIG. 3 is a configuration sectional view showing a power conversion system in Embodiment 3. In the same drawing, reference numeral 31 denotes a housing and 32 denotes a housing cover, both of which are made of a conductive member and have a role to shield the whole apparatus. In this case, the housing 31 is made of aluminum die casting and the housing cover 32 is made of plate.

36 denotes one multilayer printed wiring board that is common to a plurality of circuit units, 37 denotes a GND plane corresponding to a filter circuit unit, and 38 denotes a GND plane corresponding to a power system main circuit unit, each of the GND planes being formed by an optional one layer of the multilayer printed wiring board. More specifically, the GND planes corresponding to a plurality of closed spaces (a plurality of circuit units) are mechanically separated to be independent for each of the corresponding respective closed spaces (respective circuit units). In this case, a filter circuit unit 3 and a power system main circuit unit 4, which are mounted on the multilayer printed wiring board 36, are mounted on the same surface portion (surface layer) in a definitely separated manner as a circuit area; and only a control circuit unit 5 is mounted on a back portion (back layer) so as to be opposite to the filter circuit unit 3 and the power system main circuit unit 4.

The housing 31 includes a partition wall 33 to be connected to the GND plane 37 of the filter circuit unit 3 and a partition wall 34 to be connected to the GND plane 38 of the power system main circuit unit 4. The partition walls 33, 34 are integrally formed with the housing 31. At a screw portion, a screw hole of the multilayer printed wiring board 36 is formed in a through hole shape as in Embodiment 1 and the screw portion is fastened to the housing 31 and the partition walls 33, 34; and thus, the GND planes 37, 38 are grounded to housing potential, respectively. More specifically, the separated and independent GND planes 37, 38 are electrically connected to the housing 31, respectively.

In the thus configured power conversion apparatus, first, the filter circuit unit 3, the control circuit unit 5, and the power system main circuit unit 4 are each shielded with each other; and therefore, each circuit unit does not receive the influence of noise from other circuit units. Furthermore, the GND plane 37 of the filter circuit unit is separated from the GND plane 38 of the power system circuit unit on the multilayer printed wiring board 36; and therefore, for example, a return current that flows through the GND plane 38 of the power system main circuit unit 4 does not flow through the GND plane 37 of the filter circuit unit 3 and a disadvantage due to the return current is solved. Incidentally, the Embodiment 3 provides the multilayer printed wiring board configured by one sheet, as an example; however, the substrate may be divided for each circuit unit.

Embodiment 4

Figure 4:
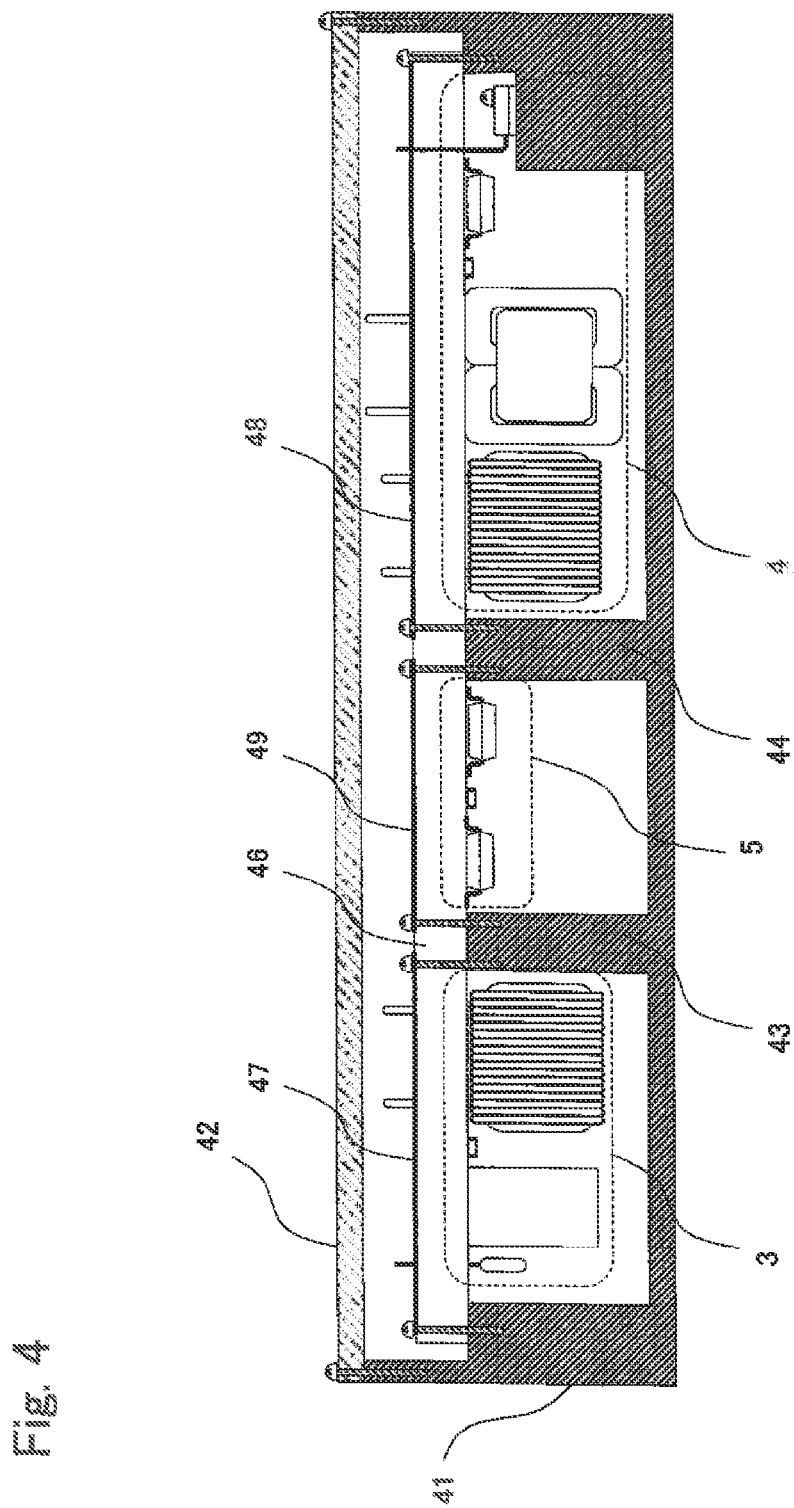
FIG. 4 is a configuration sectional view showing an in-vehicle power conversion system in Embodiment 4.

FIG. 4 is a configuration sectional view showing a power conversion system in Embodiment 4; and in the same drawing, reference numeral 41 is formed by a conductive housing and 42 is formed by a non-conductive housing cover. In this case, the housing 41 is made of aluminum die casting and the housing cover 42 is made of resin. 46 denotes a multilayer printed wiring board; 47 denotes a GND plane corresponding to the filter circuit unit 3; 48 denotes a GND plane corresponding to the power system main circuit unit 4; and 49 denotes a GND plane corresponding to the control circuit unit 5. Each of the GND planes 47, 48, 49 is separated and independent with each other; however, each GND plane is formed on an outer layer of a surface portion of the multilayer printed wiring board.

The housing 41 is integrally formed with a partition wall 43 that electromagnetically partitions the filter circuit unit 3 from the control circuit unit 5 and a partition wall 44 that electromagnetically partitions a power system main circuit unit 4 from the control circuit unit 5. In this case, all the circuit units of the filter circuit unit 3, the power system main circuit unit 4, and the control circuit unit 5, which are mounted on the multilayer printed wiring board 46, are mounted on the surface portions opposite to the GND planes in a manner to be separated from a circuit area. The multilayer printed wiring board 46 is attached with face down; and the respective circuit units are separated by the housing 41 and the partition walls 43, 44 and are attached by screw clamping. The GND planes 47, 48, 49 are connected to the housing 41 with screws and through holes, respectively.

In the thus configured power conversion apparatus, the filter circuit unit 3, the control circuit unit 5, and the power system main circuit unit 4 are shielded with each other; and therefore, each circuit unit does not receive the influence of noise from other circuit blocks. Furthermore, the GND plane 47 of the filter circuit unit 3, the GND plane 48 of the power system circuit unit 4, and the GND plane 49 of the control circuit unit 5 are separated on the multilayer printed wiring board 46; and therefore, for example, a return current that flows through the GND plane 48 of the power system main circuit unit 4 does not flow through the GND plane 47 of the filter circuit unit 3 and the GND plane 49 of the control circuit unit 5 and a disadvantage due to the return current is solved. Further, the whole system is shielded; and therefore, the housing cover 42 can be formed of a non-conductive material such as resin.

Embodiment 5

Figure 5:
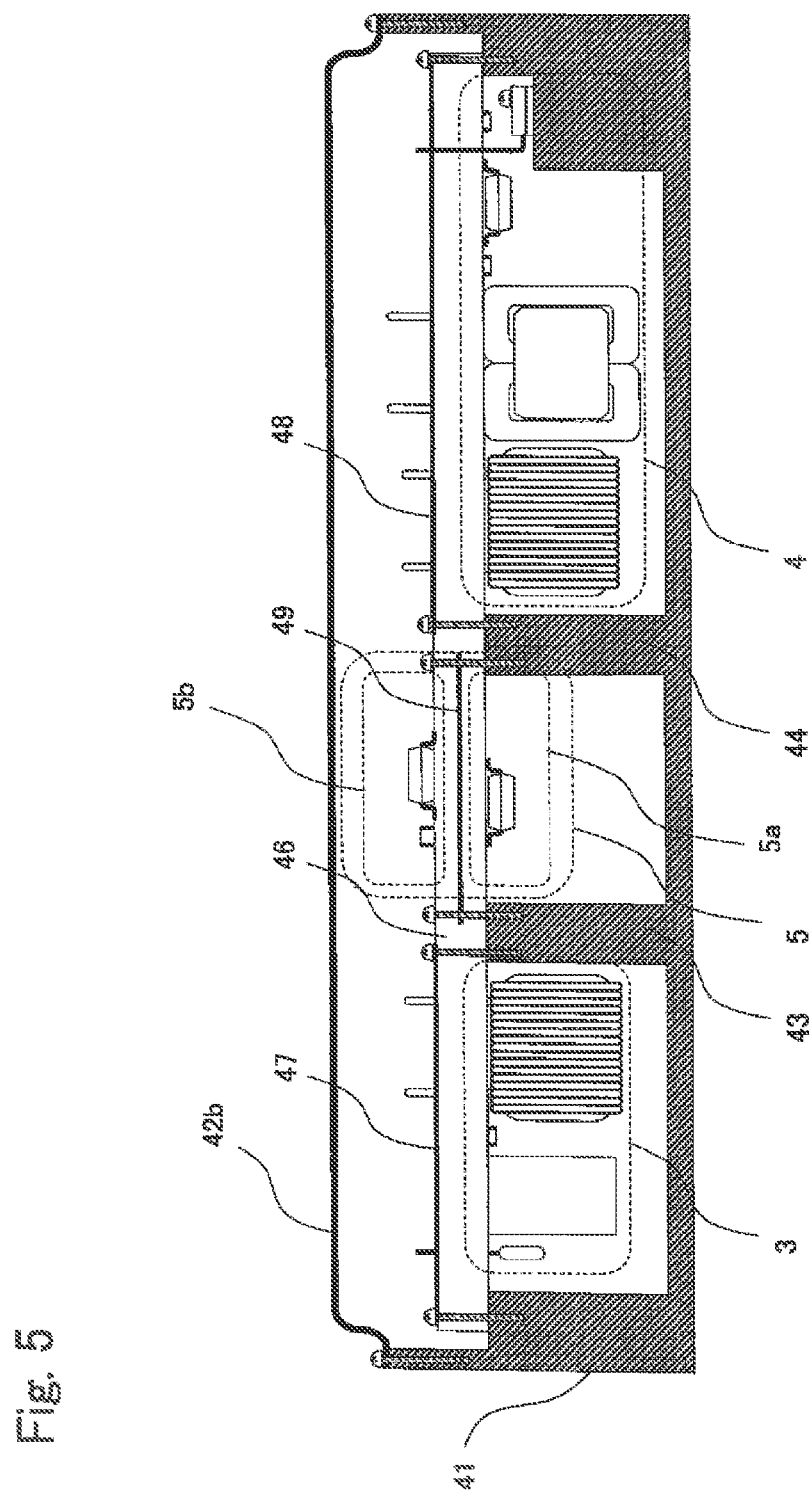
FIG. 5 is a configuration sectional view showing an in-vehicle power conversion system in Embodiment 5.

In Embodiment 4, the GND planes 47, 48, 49 of all the circuit units of the filter circuit unit 3, the power system circuit unit 4, and the control circuit unit 5 are formed on the surface portion; however, it may be used as to whether formation is made on an inner layer or formation is made on a surface layer for each unit of the respective circuit units. FIG. 5 is a configuration sectional view showing a power conversion system in Embodiment 5. In FIG. 5, only a GND plane 49 of a control circuit unit 5 is arranged on an optional inner layer. In this case, reference numeral 42b denotes a conductive housing cover and is made of plate or conductive resin material. 5a denotes a control circuit unit A and 5b denotes a control circuit unit B. The control circuit units A, B are circuit units that need to be electromagnetically separated with each other.

By such a configuration, there can be constructed four types of shield spaces: a shield space of a filter circuit unit 3; a shield space of a power system main circuit unit 4; a shield space of the control circuit unit 5a; and a shield space of the control circuit unit 5b. Thus, it is effective for cases where shielding is needed in the control circuit unit 5. Of course, the control circuit unit is not electromagnetically separated into 2, but the power system circuit unit 4 may be electromagnetically separated into 2. By this means, more detailed countermeasures against noise, such as separation of a driver from power system wiring can be made.

Furthermore, the filter circuit unit may be electromagnetically separated into 2. This enables, for example, to separate a primary filter from a secondary filter and to further improve filter performance. Besides, for example, in the case where the control circuit unit 5b is a circuit unit that does not need to be shielded, the housing cover 42 may be made of only a non-conductive resin material.

Embodiment 6

Generally, output filter circuits in a power conversion system use a common mode choke coil, a normal mode coil, and the like and treat a large current; and accordingly, the amount of heat generation of the coil exceeds several watts and it becomes a problem to establish thermally. Furthermore, in the case where a DC/DC converter is incorporated in the power conversion system, an electrical component such as a transformer and a reactor is a heating element and, more particularly, in the case of high-frequency driving, heat generation density increases and heat dissipation becomes difficult in compensation for a reduction in size of the transformer and the reactor. A structure that satisfies both shield and heat dissipation secures a heat dissipation path until a member to be heat-dissipated by a metal member such as copper or aluminum and uses a heat dissipation member such as a heat dissipation grease and a heat dissipation sheet at each portion to be thermally come in contact; and accordingly, there also exist cases in which not only an increase in the number of components, increase in size and cost of an apparatus, and deterioration in workability are caused but also sufficient heat dissipation effect cannot be obtained with respect to many items to be sacrificed. A specific structure that solves such a problem is provided in Embodiment 6.

Figure 6:
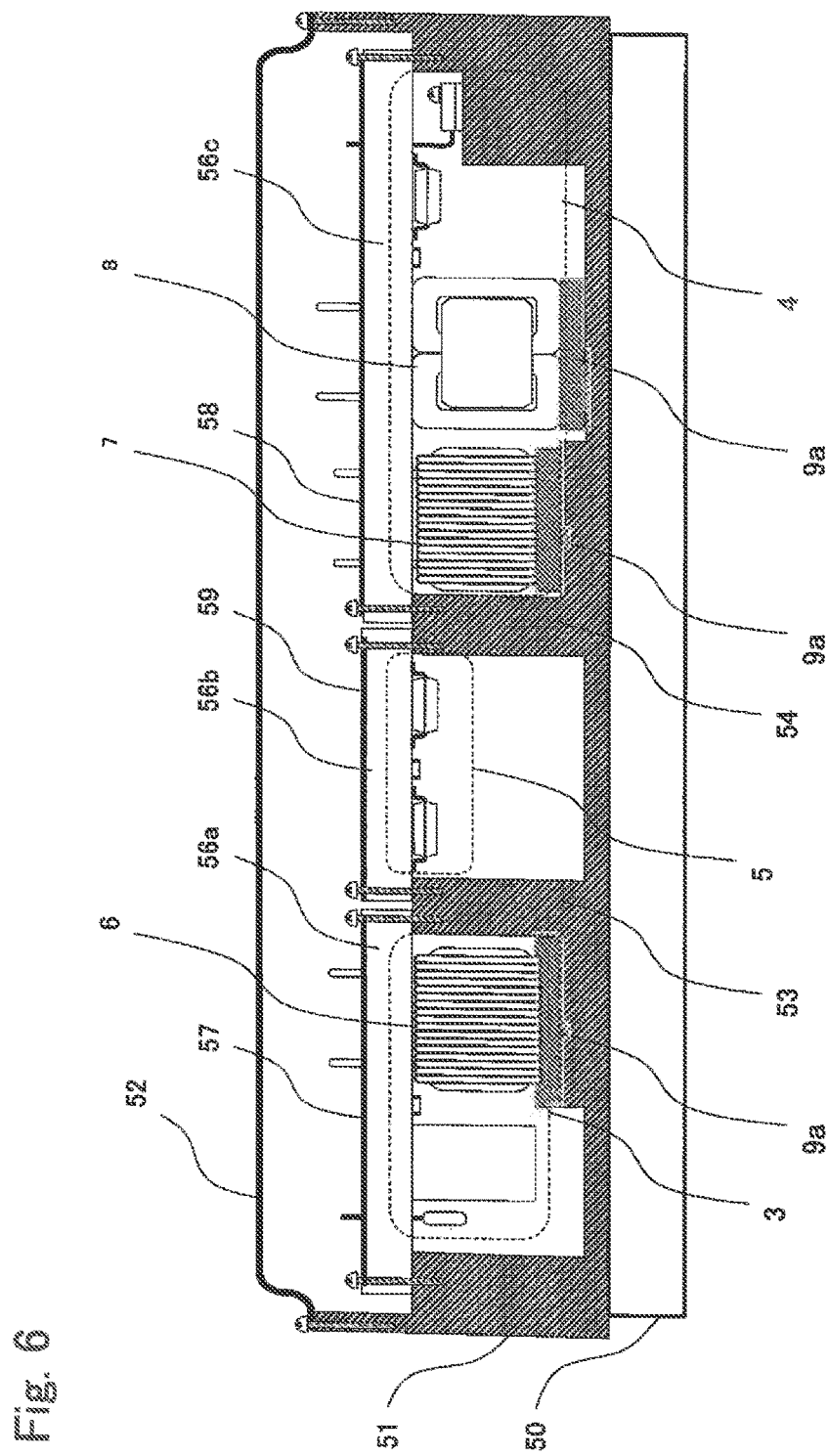
FIG. 6 is a configuration sectional view showing an in-vehicle power conversion system in Embodiment 6.

FIG. 6 is a configuration sectional view showing a power conversion system in Embodiment 6; and in the same drawing, reference numeral 51 is formed by a conductive housing and 52 is formed by a conductive housing cover. 53 denotes a partition wall and 54 denotes a partition wall, both of which are integrally formed with a housing 51. 56a, 56b, 56c are a multilayer printed wiring board for a filter circuit, a multilayer printed wiring board for a control circuit, and a multilayer printed wiring board for a power system main circuit, respectively; in this case, the multilayer printed wiring boards are separated to be independent for each circuit unit. 57 denotes a GND plane corresponding to the filter circuit unit 3, 58 denotes a GND plane of the power system main circuit unit 4, and 59 denotes a GND plane of the control circuit unit 5; and the GND planes are each formed on a surface portion and outer layers serve as the GND planes.

In this case, the GND planes 57, 58, 59 are each connected to the housing 51 by a screw and a through hole to shield each closed space. In this case, a common mode choke coil 6 is mounted on the filter circuit unit 3. A reactor 7 and a transformer 8 are mounted on the power system main circuit unit 4. 9a denotes a heat dissipation member; and in this case, a heat dissipation grease is used. 50 denotes a cooler and is formed by air-cooled cooling fins, water-cooled water-cooling paths, and the like to heat-dissipate the amount of heat of heating components of the common mode choke coil 6, the reactor 7, and the transformer 8 via the heat dissipation member 9a.

The amount of heat generation of the common mode choke coil 6, the reactor 7, and the transformer 8 is determined by the diameter and the length of winding thereof and a flowing current. More particularly, in the case of a current including high harmonics, heat generation due to a skin effect of the winding cannot also be neglected; and accordingly, in the case of reducing in size by high frequency switching, not only the amount of heat generation increases but also its heat generation density rises. In order to receive a benefit of the reduction in size by high frequency applications, it becomes a point as to how to simplify a heat dissipation structure.

If in the case of the configuration shown in FIG. 6, the multilayer printed wiring boards 56a, 56b, 56c are attached with face down without using particular additional members while maintaining shield performance and thus the top surfaces of the common mode choke coil 6, the reactor 7, and the transformer 8 face the housing side; and therefore, this heat dissipation can be made by only applying the heat dissipation grease 9a on the top surfaces. Of course, when thermal establishment is sufficiently built by only a dissipation area of the bottom surface of the housing 51 depending on the amount of heat generation, the cooler 50 is not indispensable. Furthermore, in the case where the heights of the common mode choke coil 6, the reactor 7, and the transformer 8, are different, the heat dissipation path can be secured by cladding by necessary height from the housing 51 at the corresponding portion.

Embodiment 7

Embodiment 6 shows the example of the heat dissipation grease 9a; however, the outlines of winding components such as the common mode choke coil 6, the reactor 7, and the transformer 8 are liable to vary and the heat dissipation member 9a such as grease is difficult to guarantee mass productivity. Furthermore, the heat dissipation grease 9a has aged deterioration causes such as solidification and pumping out; and the avoidance of these aged deterioration causes is also important. Embodiment 7 provides a structure in which stable heat dissipation is performed even when variation in the outlines of these windings are generated and an improvement in reliability is achieved even from the view point of aged deterioration.

Figure 7:
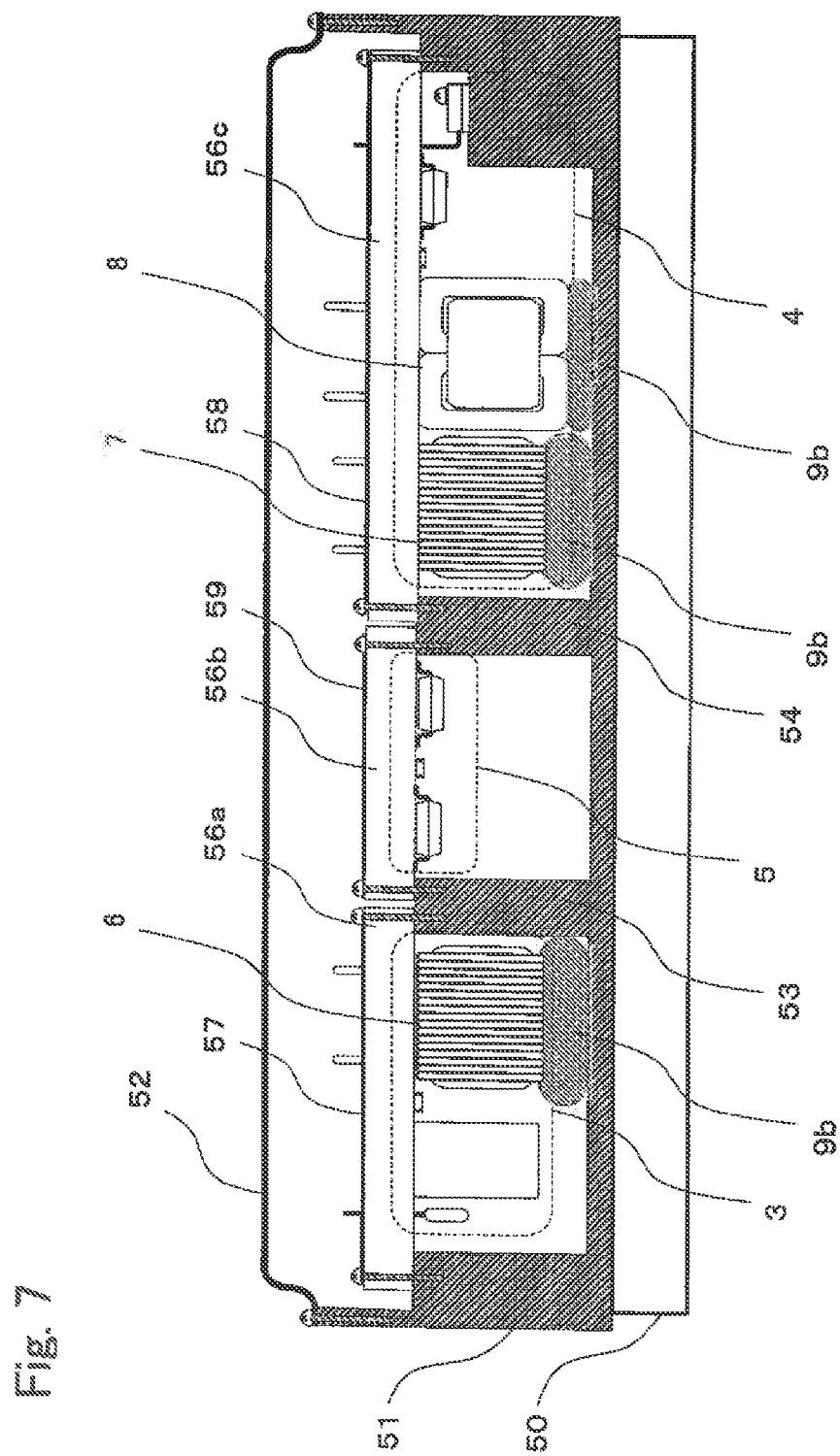
FIG. 7 is a configuration sectional view showing an in-vehicle power conversion system in Embodiment 7.

FIG. 7 is a configuration sectional view showing a power conversion system in Embodiment 7; and in this case, a common mode choke coil 6, a reactor 7, and a transformer 8 come in contact with a housing 51 via a heat dissipation sheet 9b serving as a heat dissipation member. In this case, the heat dissipation sheet 9b is an elastic body having thickness and uses a material that is low rebound and does not remain stress distortion, the material being, for example, a silicone based rubber material and an acrylic based rubber material. The amount of heat of heating components of the common mode choke coil 6, the reactor 7, and the transformer 8 is heat-dissipated to a cooler 50 via the heat dissipation sheet 9b serving as the heat dissipation member.

By such a configuration, even when the height directions of the common mode choke coil 6, the reactor 7, and the transformer 8 are fluctuated due to variation in the outlines of their windings, heat dissipation paths to the housing 51 are secured and variations in the heights thereof are absorbed by the elasticity of the heat dissipation sheet 9b by using the heat dissipation sheet 9b having elasticity.

Embodiment 8

Embodiment 7 shows the example by the heat dissipation sheet 9b having elasticity; however, the weight of winding components such as the common mode choke coil 6, the reactor 7, and the transformer 8 may become a problem as a component to be mounted on the multilayer printed wiring board. More particularly, in a severe environment of vibration requirements, the heat dissipation sheet 9b having elasticity cannot be sufficiently held depending on the weight and the multilayer printed wiring board may be deflected. Therefore, surrounding surface-mounting components are at risk of triggering the generation of a crack at a solder connection portion of the winding component and the multilayer printed wiring board, a crack of the printed wiring board, and a contact fault and accordingly a fault such as a fire disaster due to local heat generation. Furthermore, in the case of assembling the multilayer printed wiring board, the multilayer printed wiring board is pushed back due to elasticity of the heat dissipation sheet and accordingly there is also a problem of productivity in that screw clamping is difficult.

Figure 8:
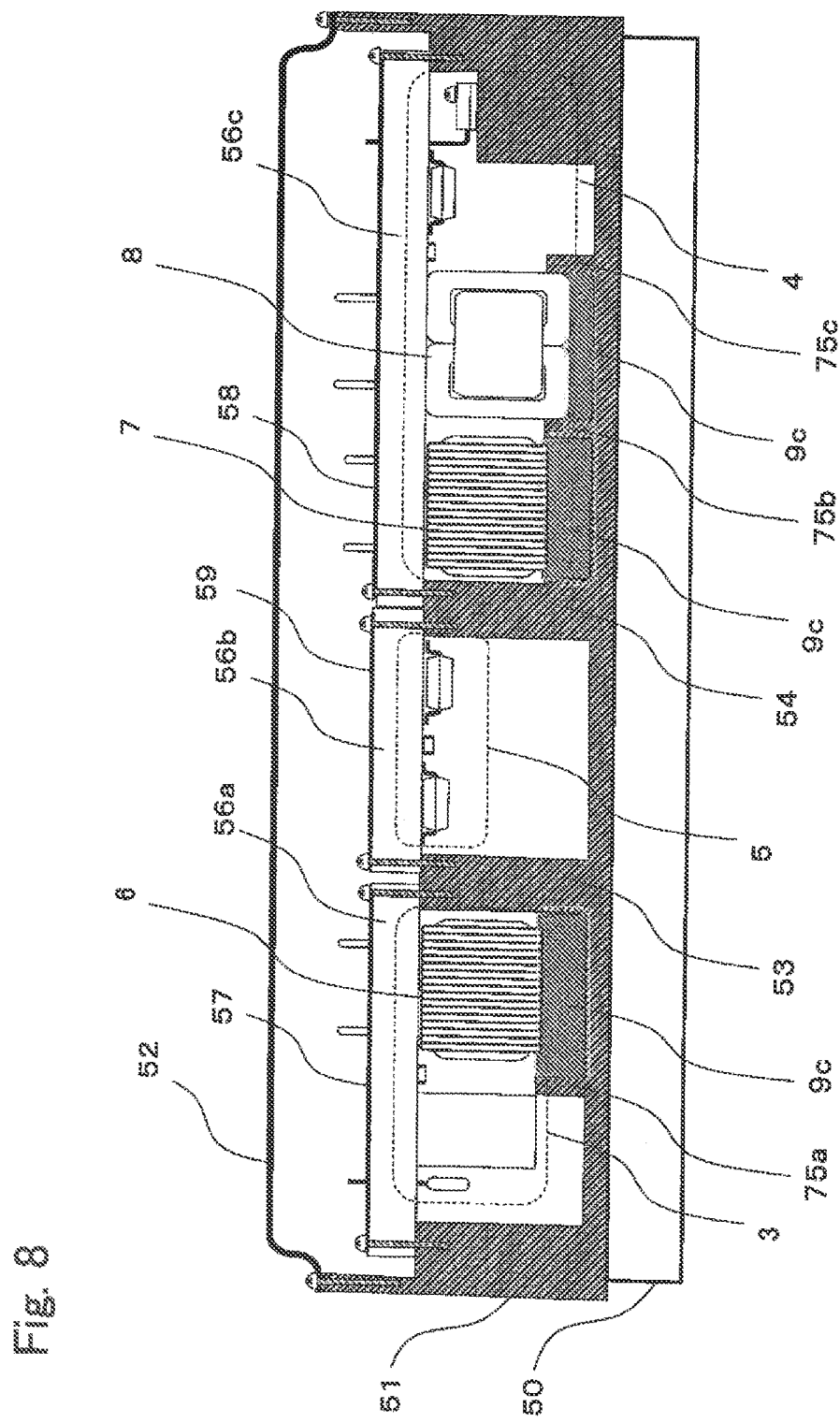
FIG. 8 is a configuration sectional view showing an in-vehicle power conversion system in Embodiment 8.

Embodiment 8 provides a structure in which these components are surely held even when these components are heavy material, stable heat dissipation is performed, and reliability is improved. FIG. 8 is a configuration sectional view showing a power conversion system in Embodiment 8. Reference numeral 9c denotes adhesive for heat dissipation and uses a potting material in this case. The potting material is, for example, silicone based and/or urethane based elastomer. Since the potting material is liquid before curing, a bank wall 75 which is for preventing leakage of the potting material is needed. 75a denotes a bank wall which prevents leakage of adhesive 9c of a common mode choke coil 6 and forms a saucer between the bank wall 75a and a partition wall 53. 75b denotes a bank wall which prevents leakage of adhesive of a reactor 7 and forms a saucer between the bank wall 75b and a partition wall 54. 75c denotes a bank wall which prevents leakage of adhesive of a transformer 8 and forms a saucer between the bank wall 75c and the bank wall 75b. Incidentally, the saucer may be formed between the bank wall and a housing 51.

In the thus configured structure, first, as for a filter circuit unit 3, the potting material is injected into the saucer surrounded by the bank wall 75a and the housing wall 53. Even when the height of the common mode choke coil 6 is a minimum value within a range of the variation, the amount of injection is a degree in which the top surface of the common mode choke coil 6 is soaked with the potting material. After that, a multilayer printed wiring board for a filter circuit 56a on which the filter circuit unit 3 is mounted is assembled with face down. At this time, the top surface of the common mode choke coil 6 is soaked with the previously injected potting material. In this case, even when there is a vertical variation in the outline of the common mode choke coil 6, the potting material is liquid and thus the variation is absorbed without generating any stress.

As in a power system main circuit unit 4, the potting material is injected into the saucer surrounded by the bank wall 75b and the partition wall 54 and the saucer surrounded by the bank wall 75b and the bank wall 75c. Even when the heights of the reactor 7 and the transformer 8 are each a minimum value within a range of the variation, the amount of injection is a degree in which each top surface is soaked with the potting material. After that, a multilayer printed wiring board for a power system main circuit 56c on which the power system main circuit unit 4 is mounted is assembled with face down. At this time, the top surfaces of the reactor 7 and the transformer 8 are soaked with the previously injected potting material. In this case, even when there is a vertical variation in the outlines of the reactor 7 and the transformer 8, the potting material is liquid and thus the variation is absorbed without generating any stress.

After that, the potting material is cured and thus the common mode choke coil 6, the reactor 7, and the transformer 8, those of which are heavy material, are fixed to the housing. As described above, if in the case of the configuration of FIG. 8, the common mode choke coil 6, the reactor 7, and the transformer 8, those of which are heavy material, are fixed to the housing 51 without using particular additional members while maintaining shield performance; and even in severe environment of vibration requirements, the multilayer printed wiring board and a solder portion thereof are held without being subject to stress, a heat dissipation path can be secured, and reduction in size and cost can be achieved.

Embodiment 9

Figure 9:
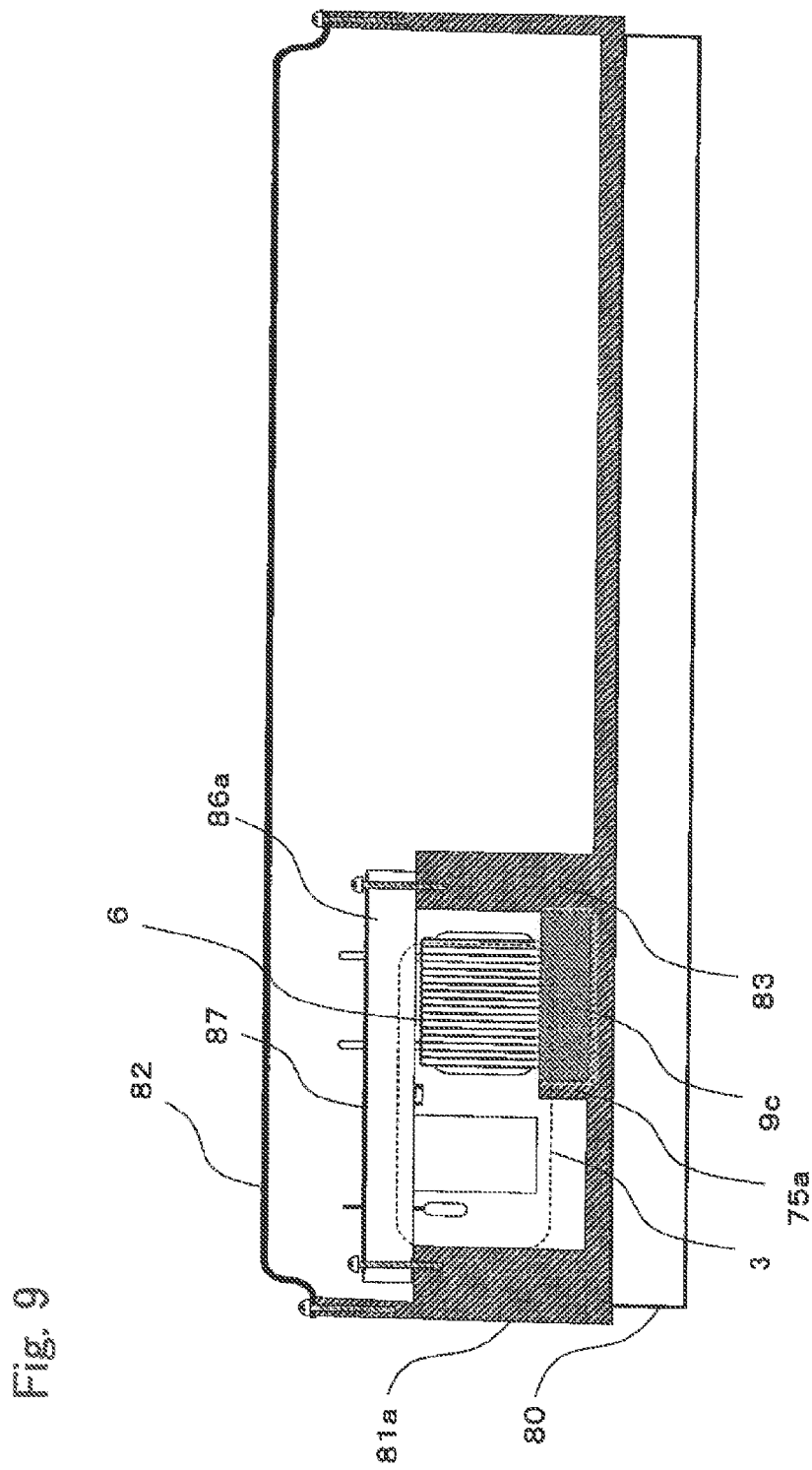
FIG. 9 is a configuration sectional view showing an in-vehicle power conversion system in Embodiment 9.

Embodiments 1 to 7 are structured such that the filter circuit unit 3, the power system main circuit unit 4, and the control circuit unit 5 are shielded, respectively; however, there can be made a structure in which only one circuit unit is shielded depending on noise specifications of a driving frequency and a mounting position of the apparatus. FIG. 9 is a configuration sectional view showing a power conversion system in Embodiment 9. It may be structured such that only a filter circuit unit 3 is shielded as shown in FIG. 9. Reference numeral 81a denotes a conductive housing, 82 denotes a conductive housing cover, 83 denotes a partition wall, 86a denotes a multilayer printed wiring board for a filter circuit, 87 denotes a GND plane, and 80 denotes a cooler.

Embodiment 10

Figure 10:
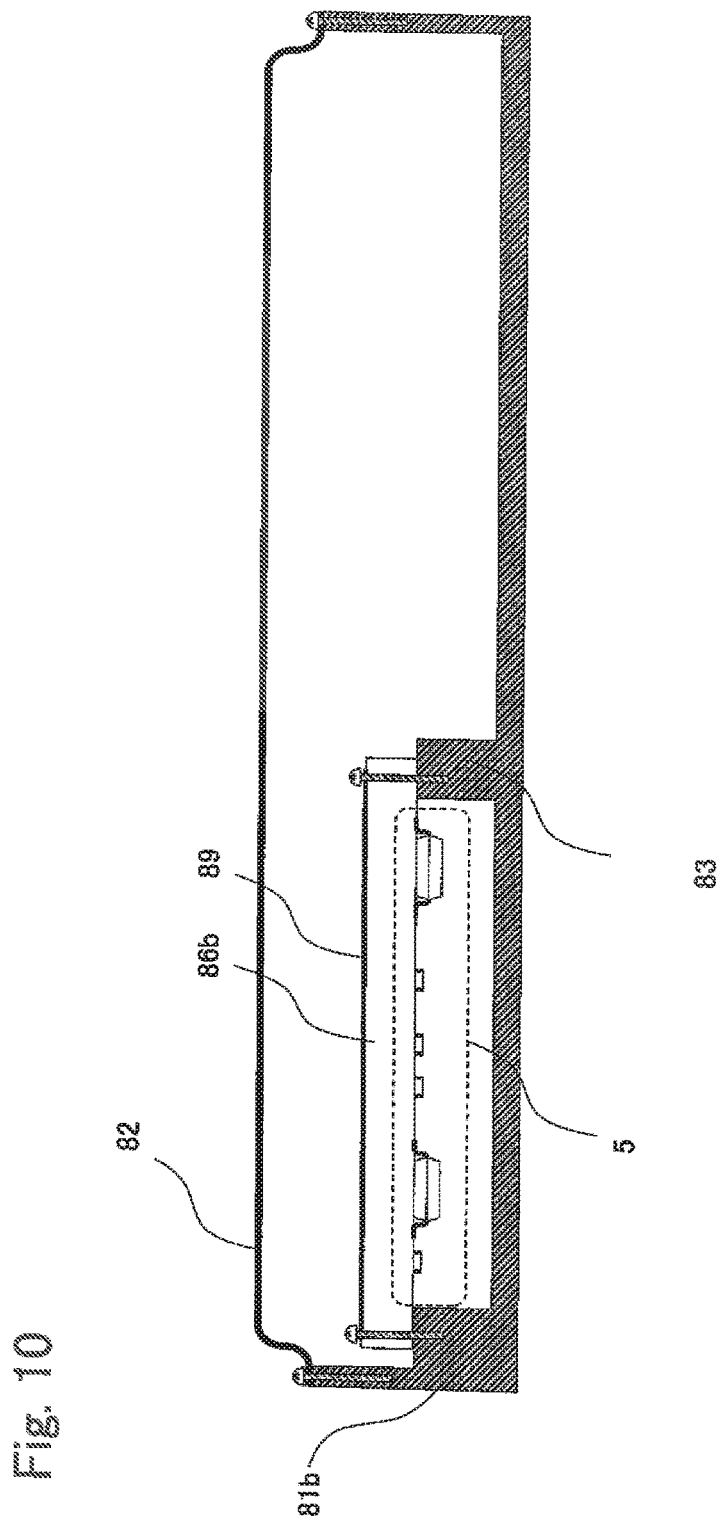
FIG. 10 is a configuration sectional view showing an in-vehicle power conversion system in Embodiment 10.

FIG. 10 is a configuration sectional view showing a power conversion system in Embodiment 10. It may be structured such that only a control circuit unit 5 is shielded as shown in FIG. 10. Reference numeral 81b denotes a conductive housing, 82 denotes a conductive housing cover, 83 denotes a partition wall, 86b denotes a multilayer printed wiring board for a control circuit, and 89 denotes a GND plane.

Embodiment 11

Figure 11:
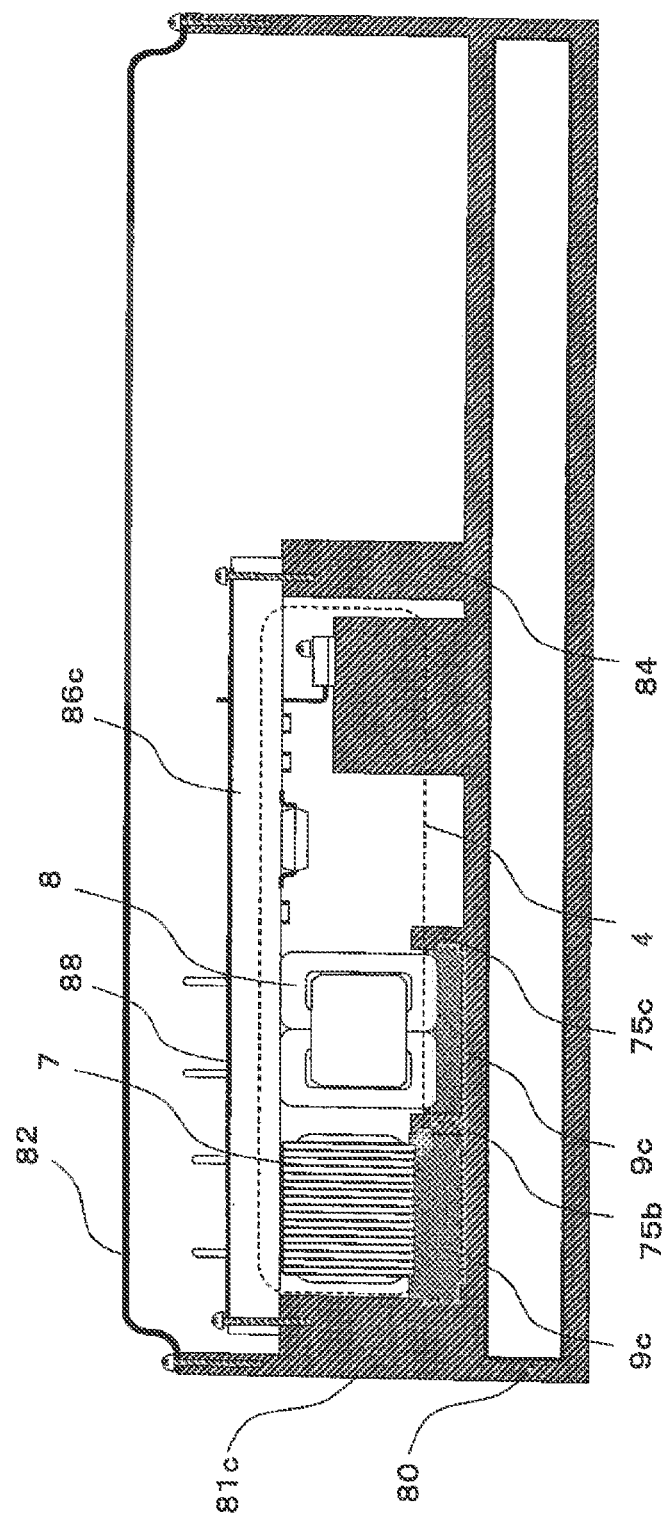
FIG. 11 is a configuration sectional view showing an in-vehicle power conversion system in Embodiment 11.

FIG. 11 is a configuration sectional view showing a power conversion system in Embodiment 11. It may be structured such that only a power system main circuit unit 4 is shielded as shown in FIG. 11. Reference numeral 81c denotes a conductive housing, 82 denotes a conductive housing cover, 84 denotes a partition wall, 86c denotes a multilayer printed wiring board for a power system main circuit, 88 denotes a GND plane, and 80 denotes a cooler.

Embodiment 12

Figure 12:
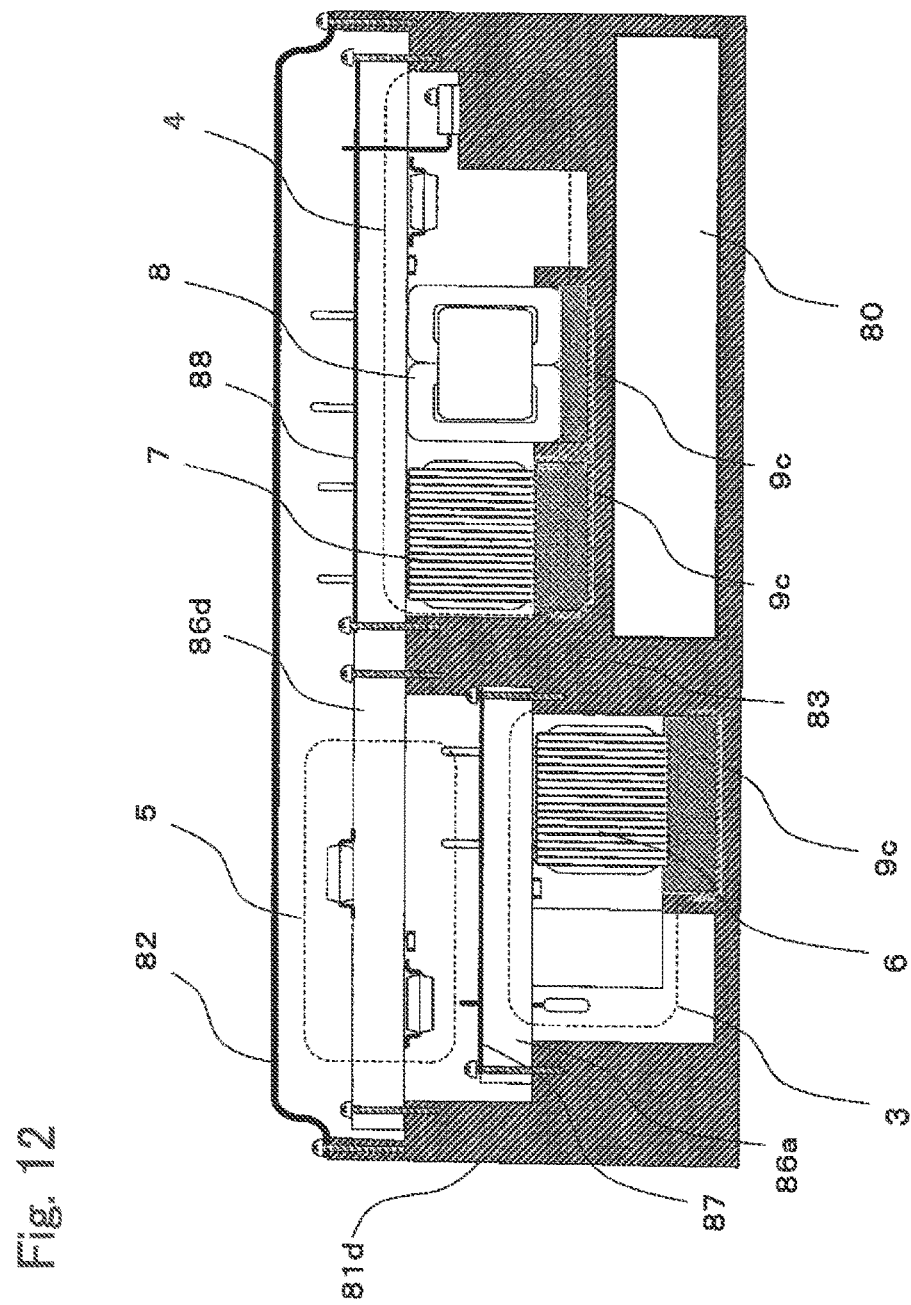
FIG. 12 is a configuration sectional view showing an in-vehicle power conversion system in Embodiment 12.

FIG. 12 is a configuration sectional view showing a power conversion system in Embodiment 12. FIG. 12 is a case in which a filter circuit unit 3 is made to be independent; and a power system main circuit unit 4 and a control circuit unit 5 are mounted on a common multilayer printed wiring board 86d. Embodiments 1 to 7 have a problem in that each circuit unit is mounted on the surface portion or the surface and back portions of the multilayer printed wiring board; and accordingly, although a thin type, an area projected from the upper side is relatively large, the volume of a cooler portion is large, and it is not necessarily preferable. In Embodiment 12, the area projected from the upper side is made small and a reduction in size including a cooler is achieved.

In the same drawing, reference numeral 81d denotes a conductive housing and 82 denotes a conductive housing cover. The housing 81d is integrally formed with a partition wall 83 which electromagnetically partitions the filter circuit unit 3 from the power system main circuit unit 4. 86a denotes a multilayer printed wiring board in which the filter circuit unit 3 is mounted, 87 denotes a GND plane, 86d denotes a multilayer printed wiring board in which the control circuit 5 and the power system main circuit 4 are mounted, and 88 denotes a GND plane for a power system main circuit.

In this case, the multilayer printed wiring board for the filter circuit 86a is attached with face down in a space surrounded by the housing 81d and the partition wall 83; and the GND plane 87 is screw-clamped and electrically connected to the housing 81d. The filter circuit unit 3 is shielded in a closed space surrounded by the GND plane 87, the housing 81d, and the partition wall 83. The multilayer printed wiring board 86d mounted with the power system main circuit 4 and the control circuit 5 are mounted on the upper side of the filter circuit unit 3; the power system main circuit unit 4 is attached with face down in a space surrounded by the partition wall 83 and the housing 81d; and the GND plane 88 is screw-clamped and is electrically connected to the partition wall 83 and the housing 81d and thus the power system main circuit unit 4 is shielded.

In this case, the control circuit unit 5 does not have a GND plane on a surface portion, but is shielded by a closed space surrounded by the GND plane 87 of the multilayer printed wiring board for the filter circuit 86a, the housing 81d, the partition wall 83, the GND plane for the power system main circuit 88, and the housing cover 82. 9c denotes a potting material serving as adhesive for heat dissipation.

In the thus configured apparatus, the filter circuit unit 3, the control circuit unit 5, and the power system main circuit unit 4 are shielded, respectively; and a common mode choke coil 6 mounted in the filter circuit unit 3 and a reactor 7 and a transformer 8 mounted on the power system main circuit unit 4 are fixed by the potting materials 9c, which absorb those dimensional variations, and are heat-dissipated via a cooler 80. Furthermore, the filter circuit unit 3 is located in the lower portion and the control circuit unit 5 and the power system main circuit unit 4 are located in the upper portion; and thus, the projected area of the apparatus becomes small and a reduction in size can be achieved while having the functions of shield, vibration proof, and heat dissipation.

Embodiment 13

Figure 13:
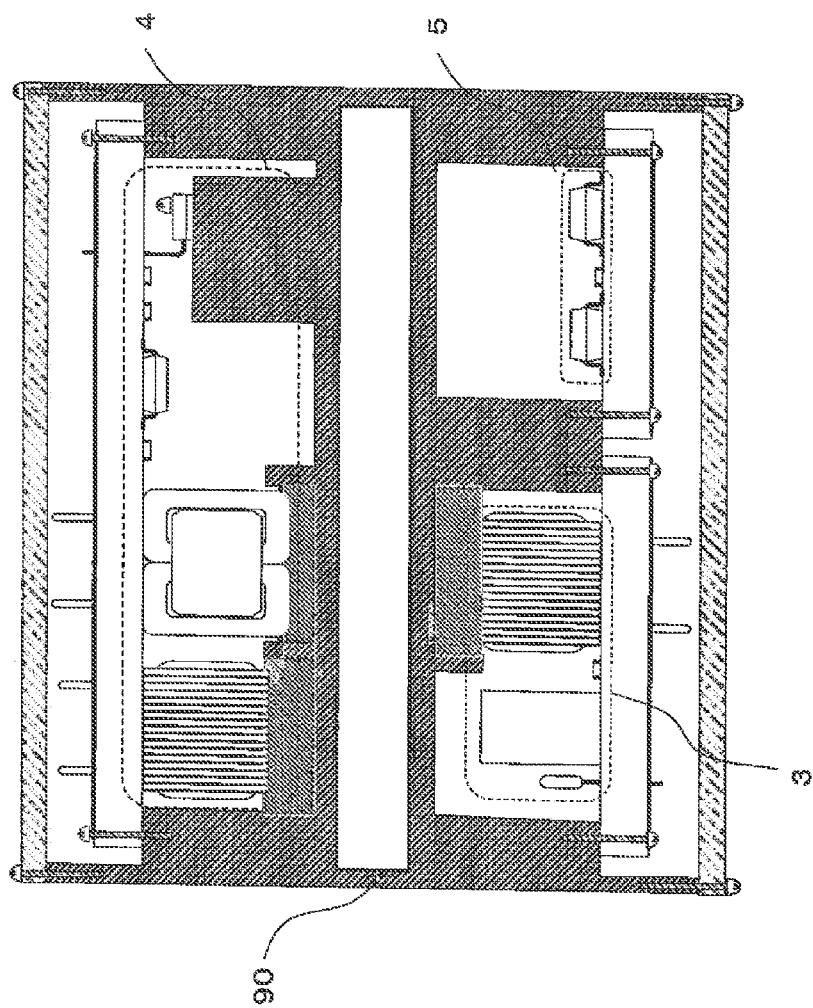
FIG. 13 is a configuration sectional view showing an in-vehicle power conversion system in Embodiment 13.
Figure 14:
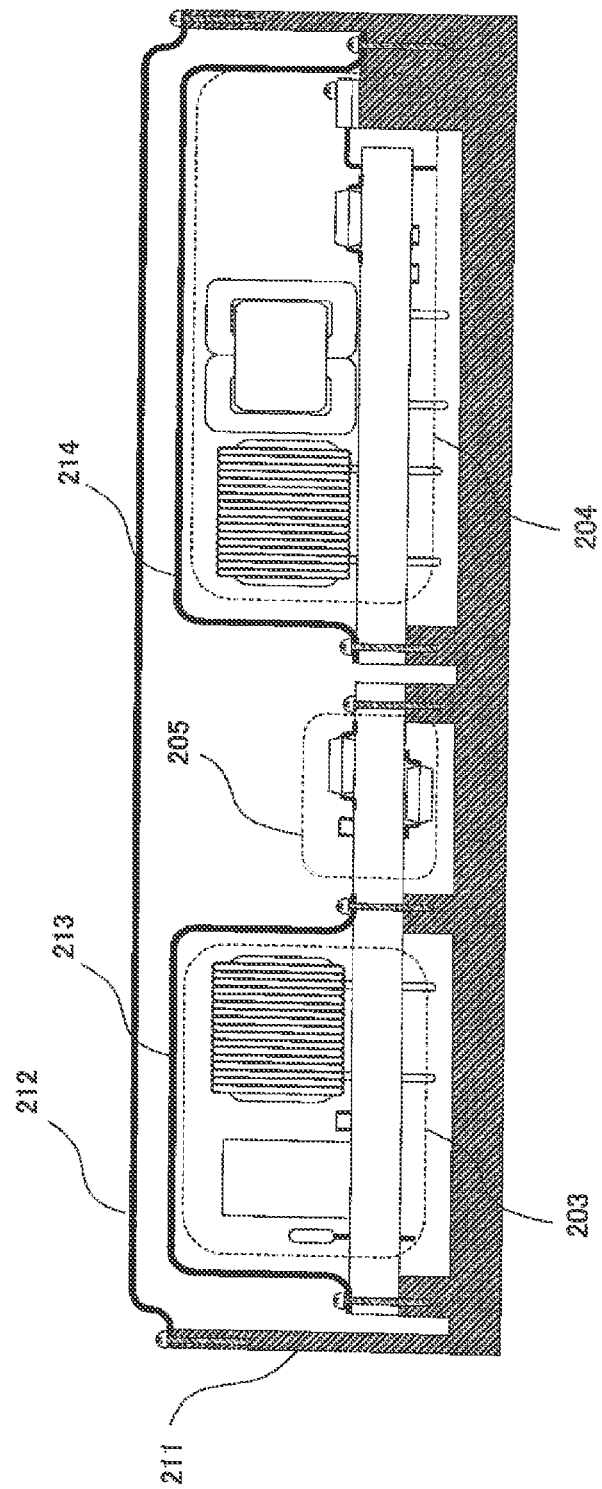
FIG. 14 is a configuration sectional view showing a conventional in-vehicle power conversion system.

FIG. 13 is a configuration sectional view showing a power conversion system in Embodiment 13, which is an example of a reduction in size. As shown in FIG. 13, an upper portion is a power system main circuit unit 4 and a lower portion is a filter circuit unit 3 and a control circuit unit 5 with a cooler 90 being sandwiched therebetween; and thus, a projected area can be further reduced and a reduction in size can be achieved. Generally, in in-vehicle application, a space to be permitted for each vehicle is different; and accordingly, a reduction in size, above all, a high degree of freedom in shape is desired. In the above-mentioned Embodiments, layout of each circuit unit can be freely structured while easily having the functions of shield, vibration proof, and heat dissipation depending on various shape specifications; and therefore, there has a merit that a degree of freedom in design is improved.

Incidentally, the present invention can freely combine the respective embodiments and appropriately change or omit the respective embodiments, within the scope of the present invention.

The invention claimed is:

1. An in-vehicle power conversion system to be equipped in an electric vehicle in which a motor serves as at least a driving source, said in-vehicle power conversion system comprising:
a conductive housing having an opening; and
a multilayer printed wiring board on which a circuit unit is mounted and which includes at least one layer as a ground (GND) plane,
wherein said multilayer printed wiring board is placed over the opening of said conductive housing to form a closed space; and
said GND plane is electrically connected to said conductive housing to shield said circuit unit disposed in the closed space surrounded by said conductive housing and said multilayer printed wiring board.

2. The in-vehicle power conversion system according to claim 1, wherein the opening is divided by a conductive partition wall to form a plurality of openings,
the circuit unit is one of circuit units which are mounted on said multilayer printed wiring board,
the closed space is one of a plurality of closed spaces which are formed by placing said multilayer printed wiring board over the plurality of the openings; and
said GND plane is electrically connected to said conductive housing to respectively shield said circuit units that are respectively disposed in the plurality of closed spaces.

3. The in-vehicle power conversion system according to claim 2, wherein
the GND plane is one of GND planes corresponding to the plurality of the closed spaces, respectively,
said GND planes are mechanically separated to be independent for each of respective closed spaces, and
said GND planes are respectively electrically connected to said conductive housing to respectively shield said circuit units.

4. The in-vehicle power conversion system according to claim 1, wherein
said GND plane is formed on a surface portion of said multilayer printed wiring board that is disposed on a first side of the multilayer printed wiring board, the first side being opposite to a second side of the multilayer printed wiring board at which the closed space is formed.

5. The in-vehicle power conversion system according to claim 2, wherein said GND plane is formed on a surface portion of said multilayer printed wiring board that is disposed on a first side of the multilayer printed wiring board, the first side being opposite to a second side of the multilayer printed wiring board at which the plurality of closed spaces is formed.

6. The in-vehicle power conversion system according to claim 3, wherein said GND planes are formed on a surface portion of said multilayer printed wiring board that is disposed on a first side of the multilayer printed wiring board, the first side being opposite to a second side of the multilayer printed wiring board at which the plurality of closed spaces is formed.

7. The in-vehicle power conversion system according to claim 4, wherein said conductive housing comprises a housing cover that covers the multilayer printed wiring board at the first side and is formed of a non-conductive material.

8. The in-vehicle power conversion system according to claim 5, wherein said conductive housing comprises a housing cover that covers the multilayer printed wiring board at the first side and is formed of a non-conductive material.

9. The in-vehicle power conversion system according to claim 6, wherein said conductive housing comprises a housing cover that covers the multilayer printed wiring board at the first side and is formed of a non-conductive material.

10. The in-vehicle power conversion system according to claim 1, wherein said circuit unit is one of circuit units which are respectively mounted on a surface portion and a back portion of said multilayer printed wiring board at a boundary of said GND plane.

11. The in-vehicle power conversion system according to claim 1, wherein the opening is formed between said conductive housing and a conductive partition wall,
said circuit unit comprises an input filter or an output filter, and
said GND plane is electrically connected to said conductive housing to shield the input filter or the output filter disposed in the closed space.

12. The in-vehicle power conversion system according to claim 11, wherein said GND plane is formed on a surface portion of said multilayer printed wiring board on a side of the multilayer printed wiring board that is opposite to another side of the multilayer printed wiring board at which the closed space is formed.

13. The in-vehicle power conversion system according to claim 1, wherein said circuit unit to be mounted on said multilayer printed wiring board is a power system main circuit or a control circuit that controls operation thereof.

14. The in-vehicle power conversion system according to claim 2, wherein said circuit unit to be mounted on said multilayer printed wiring board is a power system main circuit or a control circuit that controls operation thereof.

15. The in-vehicle power conversion system according to claim 1, wherein a heating component in said circuit unit is thermally brought into contact with said conductive housing via a heat dissipation member.

16. The in-vehicle power conversion system according to claim 2, wherein a heating component in said circuit unit is thermally brought into contact with said conductive housing via a heat dissipation member.

17. The in-vehicle power conversion system according to claim 15, wherein said heat dissipation member is an elastic body or a resin material.

18. The in-vehicle power conversion apparatus according to claim 15, wherein said heat dissipation member is an adhesive stored in a saucer formed between a conductive partition wall or said conductive housing and a bank wall.

* * * * *